(12) United States Patent
Wadell et al.

(10) Patent No.: US 11,442,098 B2
(45) Date of Patent: Sep. 13, 2022

(54) GENERATING A WAVEFORM BASED ON DIGITAL PULSES

(71) Applicant: Teradyne, Inc., North Reading, MA (US)

(72) Inventors: Brian Charles Wadell, Reading, MA (US); Richard Pye, Burlington, MA (US)

(73) Assignee: TERADYNE, INC., North Reading, MA (US)

(*) Notice: Subject to any disclaimer, the term of this patent is extended or adjusted under 35 U.S.C. 154(b) by 56 days.

(21) Appl. No.: 16/447,510

(22) Filed: Jun. 20, 2019

(65) Prior Publication Data
US 2020/0400742 A1 Dec. 24, 2020

(51) Int. Cl.
*G01R 31/28* (2006.01)

(52) U.S. Cl.
CPC ................... *G01R 31/2834* (2013.01)

(58) Field of Classification Search
CPC .......... G01R 31/2834; G01R 31/31922; G01R 31/31926; G01R 31/318522; G01R 31/31905; G01R 31/31907; G01R 31/31908; G01R 31/31917
See application file for complete search history.

(56) References Cited

U.S. PATENT DOCUMENTS

| | | | |
|---|---|---|---|
| 4,626,775 A * | 12/1986 | Cho | G01R 31/2834 324/73.1 |
| 4,656,632 A * | 4/1987 | Jackson | G01R 31/31921 702/120 |
| 4,864,077 A | 9/1989 | Wadell | |
| 4,894,753 A | 1/1990 | Wadell et al. | |
| 5,572,160 A | 11/1996 | Wadell | |
| 6,066,953 A | 5/2000 | Wadell | |
| 6,157,200 A | 12/2000 | Okayasu | |
| 6,275,023 B1 * | 8/2001 | Oosaki | G01R 31/31924 324/762.08 |
| 6,449,741 B1 * | 9/2002 | Organ | G01R 1/025 714/724 |
| 6,512,989 B1 * | 1/2003 | Deome | G01R 31/3167 702/122 |
| 6,621,566 B1 | 9/2003 | Aldrich et al. | |
| 6,651,205 B2 * | 11/2003 | Takahashi | G01R 31/31917 714/738 |
| 8,947,537 B2 | 2/2015 | Lewinnek et al. | |

(Continued)

FOREIGN PATENT DOCUMENTS

| | | |
|---|---|---|
| JP | 2002-340950 A | 11/2002 |
| JP | 2008-046019 A | 2/2008 |

OTHER PUBLICATIONS

International Search Report received for International Patent Application No. PCT/US2020/032292, 3 pages, dated Aug. 27, 2020.

(Continued)

*Primary Examiner* — Steven L Yeninas
(74) *Attorney, Agent, or Firm* — Burns & Levinson LLP

(57) ABSTRACT

Example automatic test equipment (ATE) includes a first test instrument to receive a waveform from a device under test, where the waveform is based on test signals sent from the ATE to the DUT; circuitry to generate digital pulses based on the waveform; and a second test instrument to receive the digital pulses over at least two digital pins and to process the digital pulses to test the DUT.

40 Claims, 10 Drawing Sheets

(56) References Cited

U.S. PATENT DOCUMENTS

| | | | |
|---|---|---|---|
| 9,755,766 B2 | 9/2017 | Wadell et al. | |
| 9,786,977 B2 | 10/2017 | Lyons et al. | |
| 10,048,304 B2 | 8/2018 | King et al. | |
| 10,151,791 B1* | 12/2018 | Spinner | G01R 31/3167 |
| 2002/0186004 A1* | 12/2002 | Prazeres da Costa | G06K 7/0095 |
| | | | 324/762.02 |
| 2004/0255214 A1* | 12/2004 | Hildebrant | G01R 31/31917 |
| | | | 714/742 |
| 2005/0240852 A1* | 10/2005 | Inaba | G01R 31/31908 |
| | | | 714/740 |
| 2005/0261856 A1* | 11/2005 | Kushnick | G01R 31/31907 |
| | | | 702/117 |
| 2006/0158174 A1* | 7/2006 | Marzalek | G01R 31/2822 |
| | | | 324/76.19 |
| 2007/0146183 A1* | 6/2007 | Iorga | G01R 31/31926 |
| | | | 341/120 |
| 2007/0198881 A1* | 8/2007 | Volkerink | G01R 31/31903 |
| | | | 714/724 |
| 2008/0116899 A1* | 5/2008 | Mitsuhashi | G01R 31/31928 |
| | | | 324/537 |
| 2008/0201099 A1 | 8/2008 | Suda et al. | |
| 2009/0128162 A1* | 5/2009 | Singleton | G01R 31/3191 |
| | | | 324/555 |
| 2009/0134891 A1* | 5/2009 | Tamba | G01R 31/2886 |
| | | | 324/762.02 |
| 2009/0259428 A1* | 10/2009 | Schroth | G01R 31/31907 |
| | | | 702/108 |
| 2010/0049453 A1* | 2/2010 | Watanabe | G01R 31/31924 |
| | | | 702/58 |
| 2010/0052736 A1* | 3/2010 | Watanabe | G01R 31/31924 |
| | | | 327/107 |
| 2010/0164527 A1* | 7/2010 | Weyh | G01R 31/31907 |
| | | | 324/750.3 |
| 2011/0057665 A1* | 3/2011 | Watanabe | H04L 27/0008 |
| | | | 324/537 |
| 2012/0192043 A1* | 7/2012 | Jiang | G01R 31/31716 |
| | | | 714/799 |
| 2012/0319794 A1* | 12/2012 | Watanabe | H04L 27/38 |
| | | | 332/108 |
| 2013/0102091 A1 | 4/2013 | King et al. | |
| 2013/0193993 A1* | 8/2013 | Golov | G01R 31/31907 |
| | | | 324/750.01 |
| 2014/0240518 A1 | 8/2014 | Lewinnek et al. | |
| 2015/0201052 A1* | 7/2015 | Li | H04L 25/0272 |
| | | | 455/566 |
| 2017/0146632 A1* | 5/2017 | Wadell | G01R 35/005 |
| 2017/0163358 A1 | 6/2017 | Wadell et al. | |
| 2017/0170537 A1 | 6/2017 | Lyons et al. | |
| 2017/0212164 A1* | 7/2017 | Caradonna | G01R 31/2889 |
| 2017/0328939 A1* | 11/2017 | Quan | G01R 23/20 |
| 2018/0011171 A1* | 1/2018 | McAleenan | G01R 31/2822 |
| 2018/0062883 A1* | 3/2018 | Duan | H04L 7/0008 |
| 2018/0115637 A1* | 4/2018 | Li | H04B 17/00 |
| 2018/0316420 A1 | 11/2018 | Gohel et al. | |
| 2018/0316421 A1 | 11/2018 | Gohel et al. | |
| 2018/0316423 A1 | 11/2018 | Gohel et al. | |
| 2018/0316424 A1 | 11/2018 | Gohel et al. | |
| 2018/0316990 A1 | 11/2018 | Gohel et al. | |
| 2018/0372794 A1* | 12/2018 | Roth | G01R 35/005 |

OTHER PUBLICATIONS

Written Opinion received for International Patent Application No. PCT/US2020/032292, 8 pages, dated Aug. 27, 2020.

International Preliminary Report on Patentability received for International Patent Application No. PCT/US2020/032292, 9 pages, dated Dec. 30, 2021.

* cited by examiner

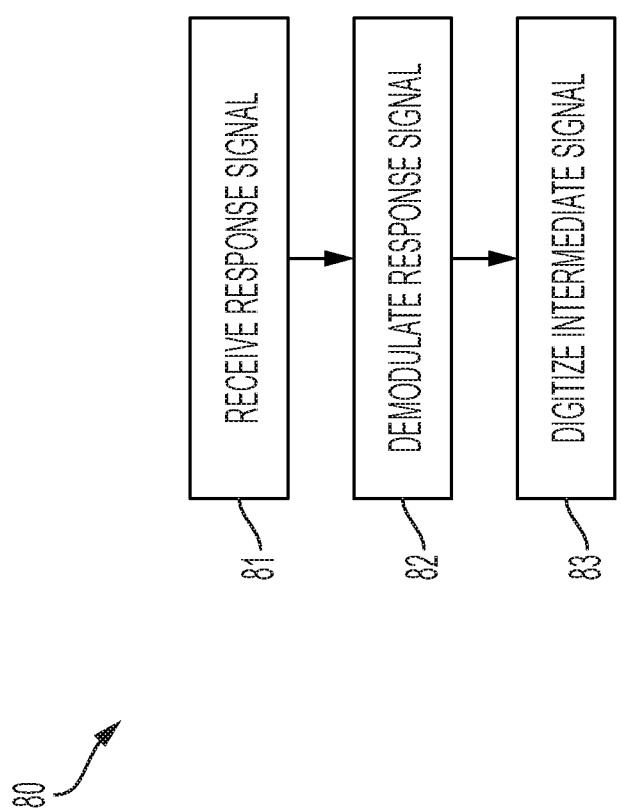

GENERATING A WAVEFORM BASED ON DIGITAL PULSES

TECHNICAL FIELD

This specification describes example implementations of a test system configured to generate a waveform based on digital pulses and configured to test a device based on the waveform.

BACKGROUND

Test systems are configured to test the operation of electronic devices, such as microprocessors and memory chips. Testing may include sending signals to a device and determining how the device reacted to those signals based on its response. The device's reaction will dictate whether the device has passed or failed testing.

SUMMARY

Example test equipment (ATE) includes a first test instrument comprising digital pins, where the first test instrument is configured to output pulses on at least two of the digital pins; circuitry to combine the pulses to produce a signal and to generate a waveform based on the signal; and a second test instrument to perform one or more tests on a device under test (DUT) based on the waveform. The example ATE may include one or more of the following features, either alone or in combination.

The first test instrument may include a pattern generator to control the pulses. The first test instrument may include a digital instrument that is programmable to produce the pulses and to vary parameters of the pulses on the at least two digital pins. The first test instrument may include a digital instrument that is programmable to control a timing of the pulses on the at least two digital pins. The first test instrument may include a digital instrument that is programmable to control widths of the pulses on the at least two digital pins. The first test instrument may include a digital instrument that is programmable to control polarities of the pulses on the at least two digital pins. The first test instrument may include a digital instrument that is programmable to control locations of the pulses on the at least two digital pins. The first test instrument may include a digital instrument that is programmable to control delays of the pulses on the at least two digital pins.

The ATE may include circuitry to modulate a radio frequency (RF) carrier signal using the waveform to produce a test signal. The second test instrument may be configured to perform the one or more tests by outputting the test signal to the DUT. The second test instrument may be configured to perform the one or more tests by outputting the waveform to the DUT. The first test instrument may be a digital test instrument and the second test instrument may be a radio frequency (RF) test instrument. The circuitry may include a bandpass filter.

The at least two digital pins may include two or more pairs of digital pins. The two or more pairs of digital pins may include a first pair of digital pins and a second pair of digital pins. First pulses on a first pair of digital pins may be wider than second pulses on the second pair of digital pins The circuitry may include an adder to add the first pulses and the second pulses.

The at least two digital pins may include two or more pairs of digital pins. The two or more pairs of digital pins may include a first pair of digital pins and a second pair of digital pins. First pulses on a first pair of digital pins may have different amplitudes than second pulses on the second pair of digital pins. The circuitry may include an adder to add the first pulses and the second pulses.

The signal may be an intermediate signal and generating the waveform may include filtering the intermediate signal to produce the waveform. Adding the first pulses and the second pulses may produce the intermediate signal having multiple steps.

The waveform may be broken into timeslots. Each timeslot may encode multiple bits of data based on a polarity of the waveform within the timeslot and a timing of a local minimum or local maximum within the timeslot. The waveform may encode two bits per timeslot. A first of the two bits may be based on the polarity and a second of the two bits being may be on whether the local minimum or the local maximum is nearer to the beginning or to the end of the timeslot.

The first test instrument may be configured to introduce delay into the pulses on the at least two digital pins to simulate time-of-flight delays of the waveform through air. The waveform may be produced independent of a dedicated waveform generator At least one of the digital pins may be controllable to drive three levels, with the three levels including logic high, logic low, and high impedance.

Example ATE includes a first test instrument to receive a waveform from a DUT, where the waveform us based on test signals sent from the ATE to the DUT; circuitry to generate digital pulses based on the waveform; and a second test instrument to receive the digital pulses over at least two digital pins and to process the digital pulses to test the DUT. The example ATE may include one or more of the following features, either alone or in combination.

The first test instrument may be a radio frequency (RF) test instrument, The second test instrument may be a digital test instrument. The waveform may include multiple timeslots. Each timeslot may contain a part of the signal comprised of a local minimum or a local maximum. Generating the digital pulses may include identifying the local minimum or the local maximum breaking the local minimum or the local maximum into one or more digital pulses for output over the at least two digital pins.

An example method includes producing a waveform. The example method comprises outputting pulses on at least two digital pins of ATE; combining the pulses to produce a signal; generating the waveform based on the signal; and performing, based on the waveform, one or more tests on a DUT being tested by the ATE. The example method may include one or more of the following features, either alone or in combination.

The example method may include controlling the pulses using a pattern generator. The example method may include programming a digital instrument to produce the pulses on the at least two digital pins. The example method may include programming the digital instrument to control a timing of the pulses on the at least two digital pins. The example method may include programming the digital instrument to control polarities of the pulses on the at least two digital pins. The example method may include programming the digital instrument to control locations of the pulses on the at least two digital pins. The example method may include programming the digital instrument to control delays of the pulses on the at least two digital pins.

The example method may include modulating a radio frequency (RF) carrier signal using the waveform to produce a test signal. Performing the one or more tests may include outputting the test signal to the DUT. The example method may include performing the one or more tests using the waveform.

The ATE may include a digital test instrument comprising the at least two digital pins; a radio frequency (RF) test instrument for performing the one or more tests on the DUT; and circuitry modulating a radio frequency (RF) carrier signal using the waveform to produce a test signal for output to the DUT by the RF test instrument to perform the one or more tests. The waveform may be filtered using a bandpass filter. The at least two digital pins may include two or more pairs of digital pins. The two or more pairs of digital pins may include a first pair of digital pins and a second pair of digital pins. First pulses on a first pair of digital pins may be wider than second pulses on the second pair of digital pins. Combining the pulses may include adding the first pulses and the second pulses. Generating the waveform may include filtering the signal. The example method may include adding the first pulses and the second pulses to produce the signal having multiple steps.

The waveform may be broken into timeslots, with each timeslot encoding multiple bits of data based on a polarity of the waveform within the timeslot and a timing of a local minimum or local maximum within the timeslot. The waveform may encode two bits per timeslot. A first of the two bits may be based on the polarity and a second of the two bits may be based on whether the local minimum or local maximum is nearer to the beginning or to the end of the timeslot.

The example method may include introducing delay into the pulses on the at least two digital pins to simulate time-of-flight delays of the waveform through air. The example method may include programming a digital instrument to control widths of the pulses on the at least two digital pins.

Any two or more of the features described in this specification, including in this summary section, may be combined to form implementations not specifically described in this specification.

At least part of the example test systems and processes described in this specification may be configured or controlled by executing, on one or more processing devices, instructions that are stored on one or more non-transitory machine-readable storage media. Examples of non-transitory machine-readable storage media include read-only memory, an optical disk drive, memory disk drive, and random access memory. At least part of the example test systems and processes described in this specification may be configured or controlled using a computing system comprised of one or more processing devices and memory storing instructions that are executable by the one or more processing devices to perform various control operations.

The details of one or more implementations are set forth in the accompanying drawings and the following description. Other features and advantages will be apparent from the description and drawings, and from the claims.

DESCRIPTION OF THE DRAWINGS

FIG. 11 is a flowchart showing an example process for generating digital pulses from a response signal received from a device under test.

Like reference numerals in different figures indicate like elements.

DETAILED DESCRIPTION

Automatic test equipment (ATE) is an example of a test system used to test electronic devices. ATE may be modular in that the ATE may include multiple test instruments that can be connected to, and disconnected from, the ATE. In an example, a test instrument is an electronic device that is configured to send signals to a device under test (DUT) and to determine how the DUT reacted to those signals based on its response. Example test instruments that may be part of the ATE include digital test instruments and radio frequency (RF) test instruments. A digital test instrument includes digital pins that are for outputting and for receiving digital data, also referred to as pulses. An RF test instrument may include coaxial cable or other transmission media for outputting and for receiving radio frequency signals. Other types of test instruments for outputting and receiving other types of signals may also be included in the ATE.

In an example, ATE includes a first test instrument having digital pins. The first test instrument may include a digital instrument configured to output pulses on at least two of the digital pins. For example, the first test instrument may be configured to output a first sequence of pulses on a first digital pin and to output a second, different sequence of pulses on a second digital pin. A pattern generator in the first test instrument may be configured to control the pulses on the pins. Circuitry, such as a digital adder, may be configured to combine the pulses from the first digital pin and the second digital pin to produce an intermediate signal. The intermediate signal may be a digital signal containing pulses having positive and negative polarities. A filter, such as a bandpass filter (BPF) is configured to filter the intermediate signal to produce an analog waveform. A second test instrument, such as an RF test instrument, may perform one or more tests on a DUT based on the waveform. Thus, the ATE may use the digital pins on one test instrument, such as a digital test instrument, to generate a signal used for testing by another test instrument, such as an RF test instrument. This may be done independent of—for example, without the use of—a dedicated arbitrary waveform generator (AWG) instrument. This can be advantageous, particularly when dealing with waveforms having bandwidths of about 500 megahertz (MHz) or more. In this regard, signals having bandwidths of about 500 MHz or more can be costly to generate using an AWG and can be difficult to measure using standard ATE baseband instruments. In some implementations, a standard digital instrument may be used or an application-specific integrated circuit (ASIC) or a field-programmable gate array (FPGA) may be used to generate one or more sequences of pulses on digital pins.

Figure 1:
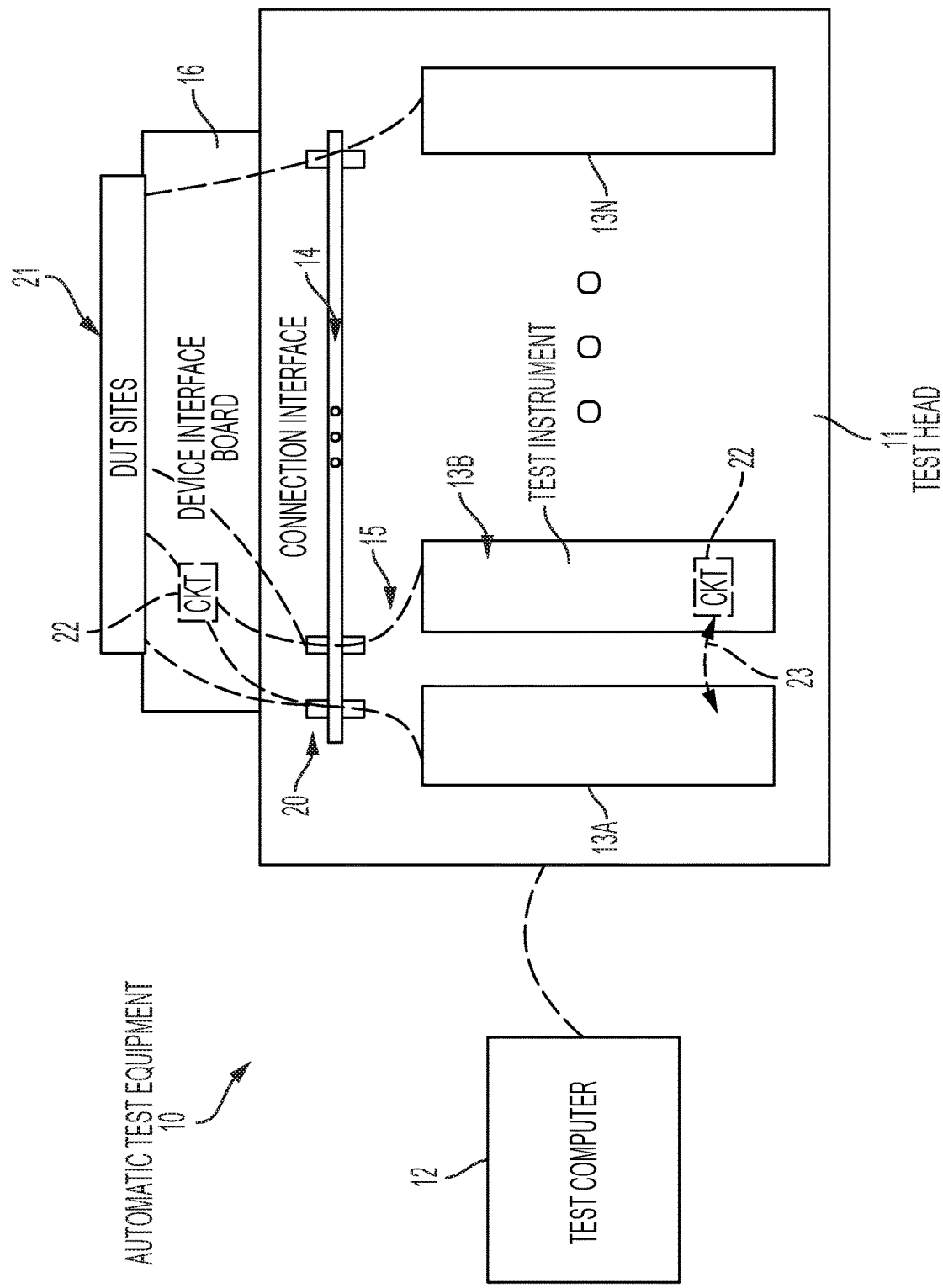
FIG. 1 is a block diagram of an example test system.

FIG. 1 shows an example of ATE 10 that is modular and that may be configured to generate waveforms for testing based on pulses output on digital pins. In FIG. 1, the dashed lines indicate potential signal paths between devices and instruments in the ATE and do not necessarily represent actual transmission media.

ATE 10 includes a test head 11 and a test computer 12. Test head 11 interfaces to DUTs (not shown) on which tests are performed. Test computer 12 communicates with test head 11 to control testing. For example, test computer 12 may download test program sets to test instruments on the test head, which then run the test program sets to test DUTs in communication with the test head.

ATE 10 includes test instruments 13A to 13N. In this example, one or more of the test instruments include one or more digital test instruments configured to output digital test signals for testing a DUT and one or more RF test instruments configured to output RF signals for testing the DUT. However, other types of test instruments may be used in addition to digital and RF test instruments. For example, test instruments may be used that are configured to force analog voltage and current to a test channel to test the DUT. Each test instrument may be configured to output test signals to test a DUT, and to receive signals from the DUT. The signals received may include response signals that are based on the test signals and/or signals that originate from the DUT that are not prompted by—for example, are not in response to—the test signals.

Signals are sent to, and received from, the DUT over multiple test channels. In some examples, a test channel may include the physical transmission medium or media over which signals are sent from the test instrument to a DUT and over which signals are received from the DUT. Physical transmission media may include, but are not limited to, electrical conductors alone or in combination with optical conductors, wireless transmission media, or both optical conductors and wireless transmission media. Electrical conductors may include coaxial cable for transmitting RF signals. In some examples, a test channel may include a range of frequencies over which signals are transmitted over one or more physical transmission media.

ATE 10 includes a connection interface 14 that connects test instrument test channels 15 to a DIB 16. Connection interface 14 may include connectors 20 or other devices for routing signals between the test instruments and DIB 16. For example, the connection interface may include one or more circuit boards or other substrates on which such connectors are mounted. Conductors that define the instrument test channels may be routed through the connection interface and the DIB.

In the example of FIG. 1, DIB 16 connects, electrically and mechanically, to test head 11. The DIB includes sites 21, which may include pins, conductive traces, or other points of electrical and mechanical connection to which DUTs may connect. Test signals, response signals, and other signals pass via the test channels over the sites between the DUT and test instruments. DIB 16 also includes, among other things, connectors, conductive traces, and circuitry for routing signals between the test instruments, DUTs connected to sites 21, and other circuitry.

In the example of FIG. 1, test instrument 13A is a digital test instrument, referred to as digital instrument 13A. In the example of FIG. 1, test instrument 13B is an RF test instrument, referred to as RF instrument 13B. Digital instrument 13A includes multiple digital pins to output test signals to the DUT and to receive test signals from the DUT. Each digital pin may be a separate channel between the digital instrument and the DIB. RF instrument 13B includes one or more coaxial connections to output test signals to the DUT and to receive test signals from the DUT. Each coaxial connection may be a separate channel between the digital instrument and the DIB. In an example, a coaxial connection includes a transmission line having an electrically conducting outer material that surrounds an insulating material that, in turn, surrounds a central conductor. The outer material acts as a return for the central conductor. In some implementations, the test channels between the RF instrument and the DIB may be implemented using transmission media other than coaxial connections.

ATE 10 also includes circuitry for converting pulses output on the digital pins into a waveform that is modulated with an RF carrier signal to produce a test signal. The test signal may be output to the DUT from, for example, the RF instrument. The circuitry may also be configured to convert a waveform to digital pulses for use by the digital instrument. In some implementations, this circuitry (CKT) 22 may be located on DIB 16, as shown in dashed lines in FIG. 1. In these implementations, communications between digital instrument 13A and RF instrument 13B pass through DIB 16. In some implementations, this circuitry 22 may be located on RF instrument 13B, as shown in dashed lines in FIG. 1. In these implementations, communications between digital instrument 13A and RF instrument 13B are direct as illustrated conceptually by arrow 23 and do not pass through the DIB.

Figure 2:
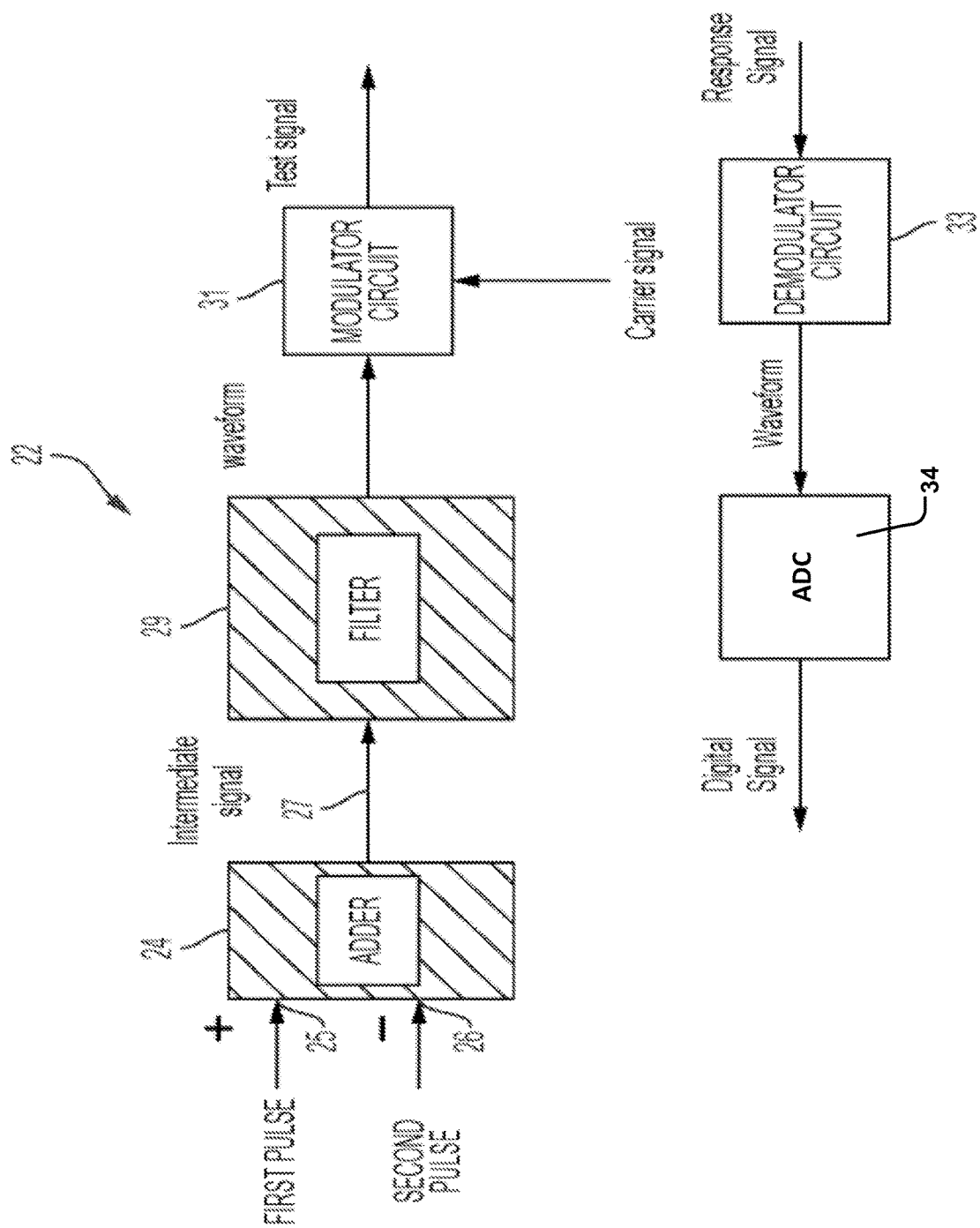
FIG. 2 is a block diagram of example circuitry included in the test system.

FIG. 2 shows an example implementation of components of circuitry 22 to generate the test signal. Circuitry 22 includes a digital adder circuit 24 that receives pulses at inputs 25, 25 and that combines the pulses to produce an intermediate signal 27, which is a digital signal. For example, the pulses may be summed to produce the intermediate signal. Circuitry 22 includes a filter 29—in this example, a bandpass filter—to produce a waveform based on the intermediate signal. In general, the filter smooths the intermediate signal that is digital to produce a waveform that is analog. In some implementations, the intermediate signal and the waveform may be the same signal. That is, the intermediate signal may be the waveform that is used and the waveform may be generated simply by passing the intermediate signal.

A modulator circuit 31 modulates an RF carrier signal using the waveform to produce a test signal, such as an RF test signal, that is analog. In an example, the RF test instrument outputs the test signal to the DUT and receives a response signal from the DUT. The response signal may be an RF signal as well. In some implementations, circuitry 22 also includes a demodulator circuit 33 to demodulate the response signal to produce a waveform and an analog-to-digital converter (ADC) 34 to produce a digital signal based on the waveform. The digital signal may then be sent to digital instrument 13A for processing. In some implementations, this response signal may be processed by RF instrument 13B. Processing in either case may include determining whether the DUT passed or failed testing given a known stimulus and the response thereto.

Figure 3:
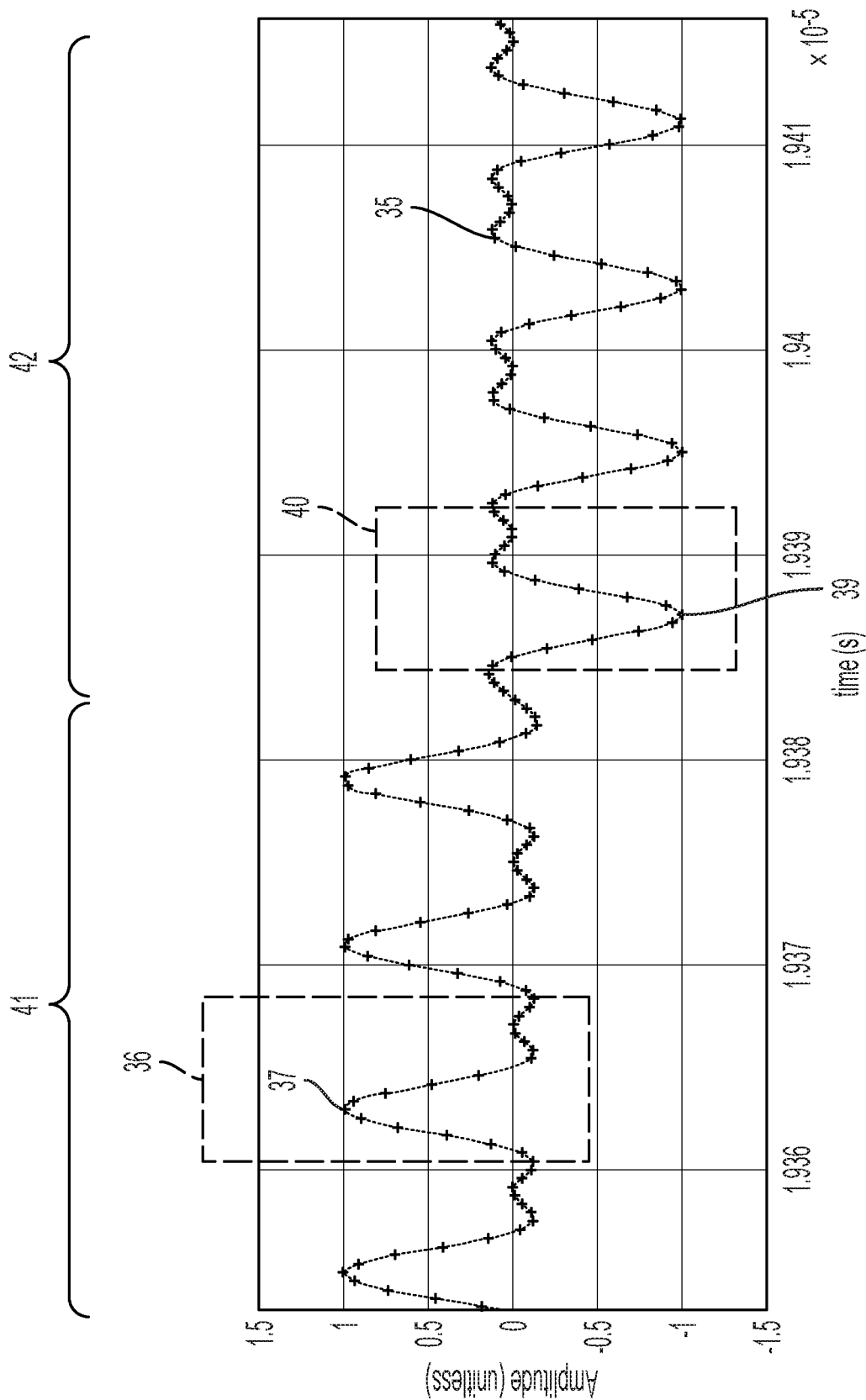
FIG. 3 is a graph of an example waveform that may be generated by the test system based on digital pulses.
Figure 4:
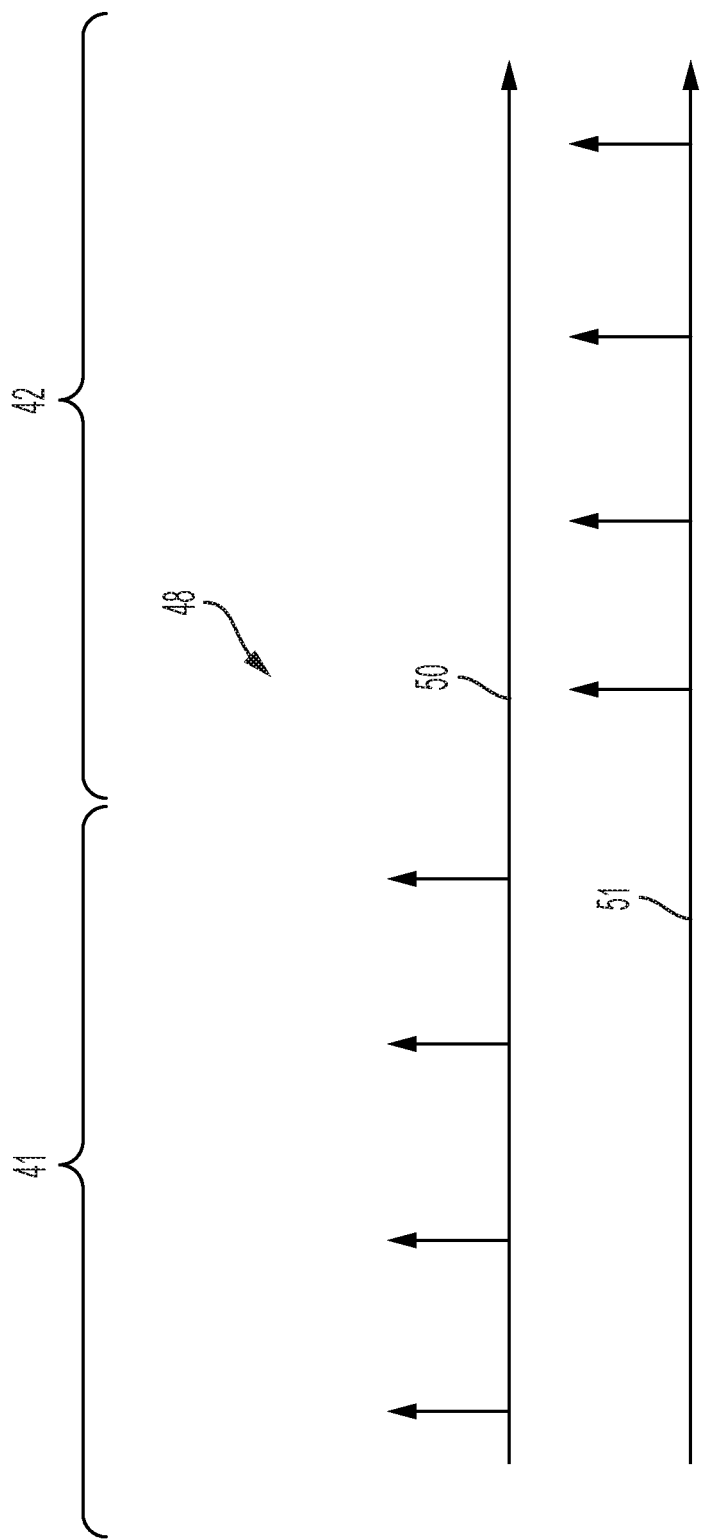
FIG. 4 includes graphs showing the digital pulses used to generate the waveform.

FIG. 3 shows an example waveform 35 that may be modeled and generated using the systems described herein. Waveform 35 may encode data using bi-orthogonal keying. Waveform 35 may be broken into timeslots, such as timeslots 36 and 40. Each timeslot may include a local maximum 37 as is the case in timeslot 36 or a local minimum such as local minimum 39 in timeslot 40. Waveform 35 may be generated from pulses that constitute digital data. FIG. 4 shows an example of a set of pulses 48 that may be used to generate waveform 35. Pulses for part 41 of the waveform having a positive polarity may be output from the digital instrument to the test channel on a first digital pin. This series of pulses is represented on channel 50. Pulses for part 42 of the waveform having a negative polarity may be output from the digital instrument to the test channel on a second digital pin that is different from the first digital pin. This series of pulses is represented on channel 51. In some implementations, polarity indicates whether the signal is positive or negative.

Figure 5:
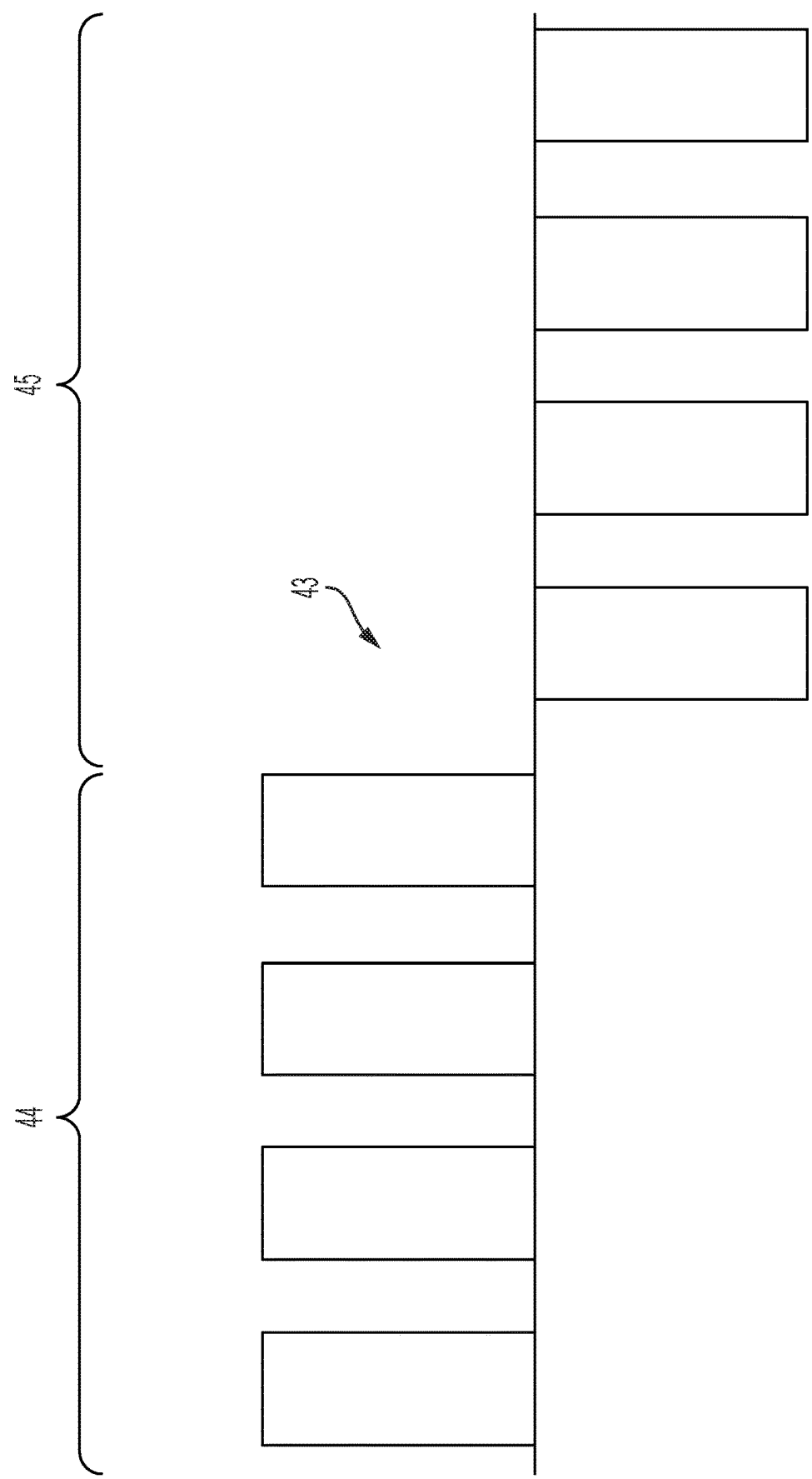
FIG. 5 is an example of an intermediate signal generated based on the digital pulses.

To generate the intermediate signal shown in FIG. 5, the first pulses for the part 41 of the waveform having the positive polarity are added at input 25 of the adder circuit 24 and the second pulses for the part 42 of the waveform representing a negative polarity are subtracted at input 26 of the adder. In the example of FIG. 5, the resulting intermediate signal 43 includes part 44 having a positive polarity and part 45 having a negative polarity. Although the example of FIG. 5 is depicted as a square wave, that need not be the case. Filter 29 and modulator circuit 31 generate the test signal based on the intermediate signal 43 in the manner described previously.

In some implementations, the test instrument is programmable to control a timing of the pulses on the digital pins, to control widths of the pulses on the digital pins, to control the polarities (positive or negative) of the pulses on the digital pins, to control locations of the pulses in a sequence or series, and to control—for example, to introduce—delays for the pulses on the digital pins. For example, the test instrument may be configured to delay the pulses on digital pins to simulate time-of-flight delays of the waveform through air. This may be useful in simulating localization functionality on a device that is being tested. In an example, localization includes outputting a signal and detecting a reflection of that signal. This is done for multiple times and at multiple different locations. By correlating the reflections to the output, the device is able to determine the distance the signal traveled. Knowing the distance that the signal has traveled for multiple—for example, three—reference locations enables the device to determine its location relative to the reference locations. In some implementations, timing, delay, and location are related. For example, timing can mean location within a pattern or location of a pulse relative to another waveform's pattern timing.

Figure 6:
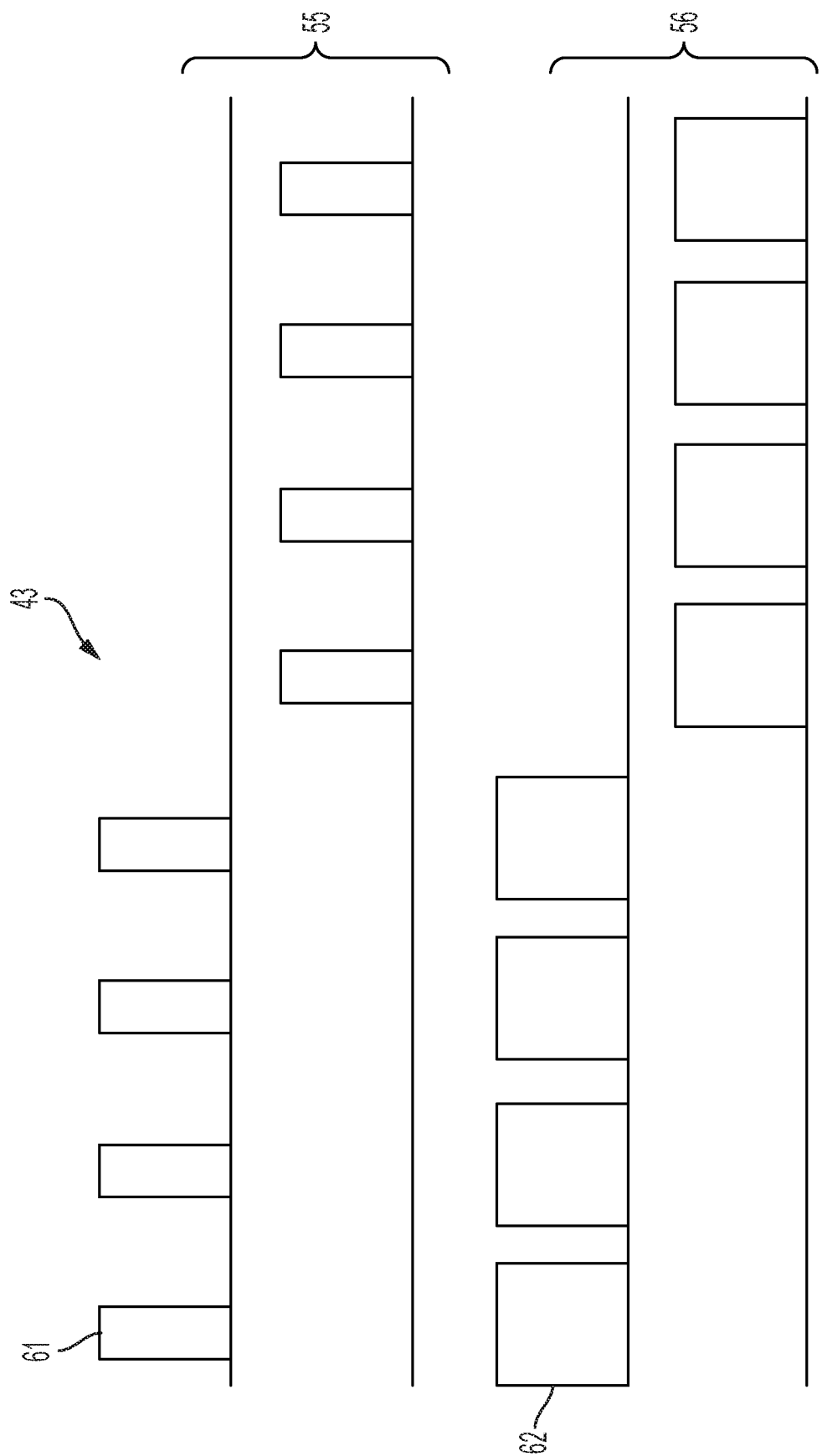
FIG. 6 includes graphs of digital pulses output on two pairs of digital pins of a digital test instrument.
Figure 7:
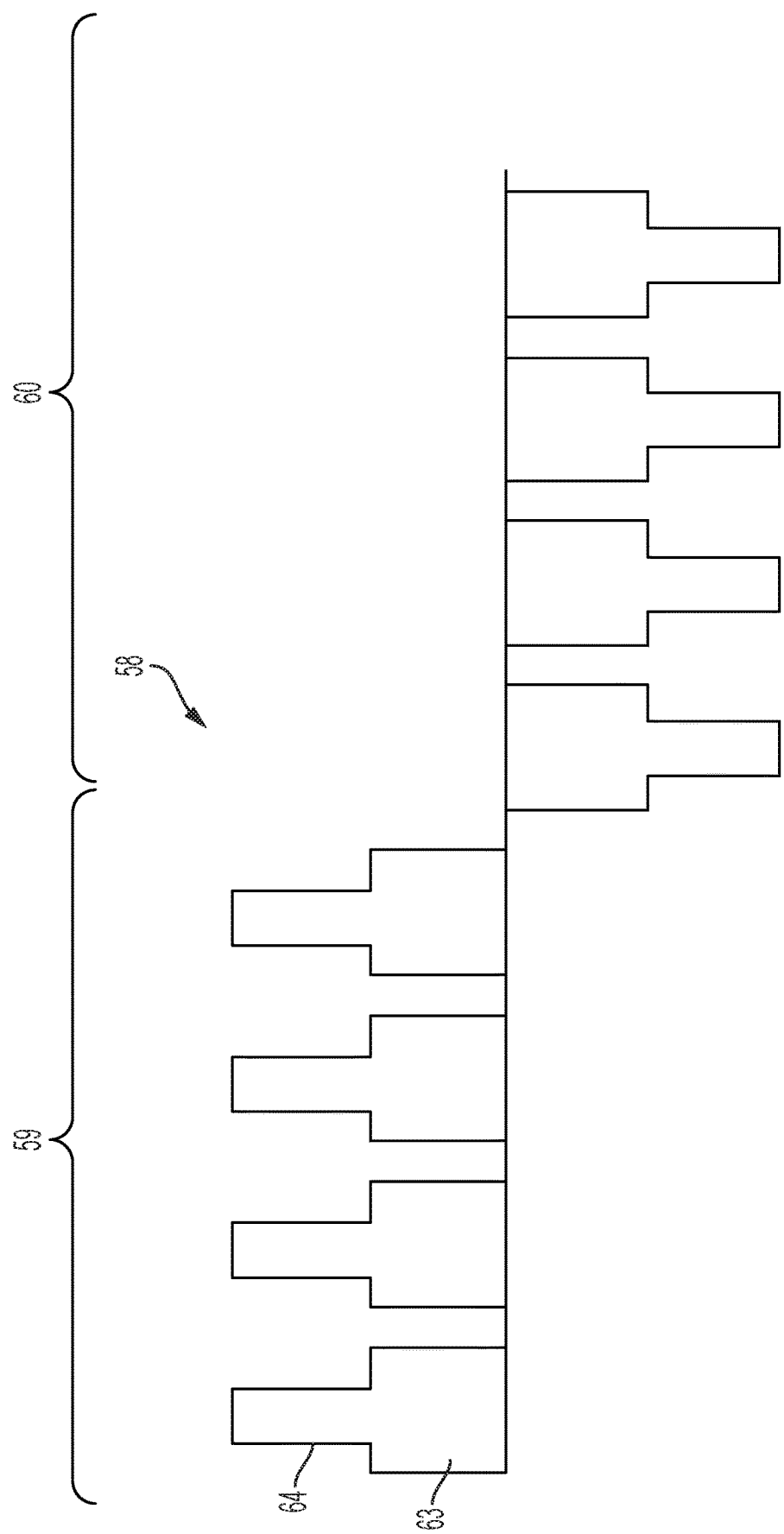
FIG. 7 is a graph of an intermediate signal generated by combining digital pulses from two pairs of digital pins of a digital test instrument.

As noted, the test instrument is programmable to control a timing of the pulses on one or more of the digital pins and to control widths of the pulses on the digital pins. By controlling pulse widths and timing of pulses on the digital pins, it is possible to produce an intermediate signal that has multiple steps. Increasing the number of steps may increase the resolution of the final waveform. For example, referring to FIG. 6, a first pair 55 of digital pins on the digital instrument may output pulses having a first, narrow width. A second pair 56 of digital pins on the digital instrument may output pulses having a second, wider width. In this context, the terms narrow and wide do not have any specific numeral connotations, but rather indicate relative widths. The centers of the narrow and wide pulses on respective pins are aligned. In the manner described previously, the pulses for the parts of the waveforms from different digital pins having positive polarities are added together and the pulses for the parts of the waveform from different digital pins having the negative polarities are subtracted. For the pulses of FIG. 6, the resulting intermediate signal 58 of FIG. 7 includes a stepped part 59 having a positive polarity and stepped part 60 having a negative polarity. These stepped parts are formed due to the addition or subtraction of different pulses having different widths. In an example, pulses 61 and 62 of FIG. 6 are combined, resulting in portion 63 of intermediate signal 58 having a magnitude equal to that of pulse 62 and a portion 64 having a magnitude equal to that of pulse 61 and pulse 62 summed. For example, if pulse 61 has a magnitude of one and pulse 62 has a magnitude of one, then portion 63 has a magnitude of one and portion 64 has a magnitude of two—that is, one plus one.

Figure 8:
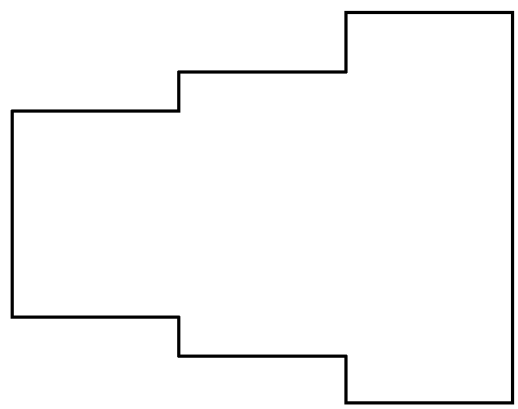
FIG. 8 shows a portion of an intermediate signal generated by combining pulses from three digital pins of a digital test instrument.
Figure 9:
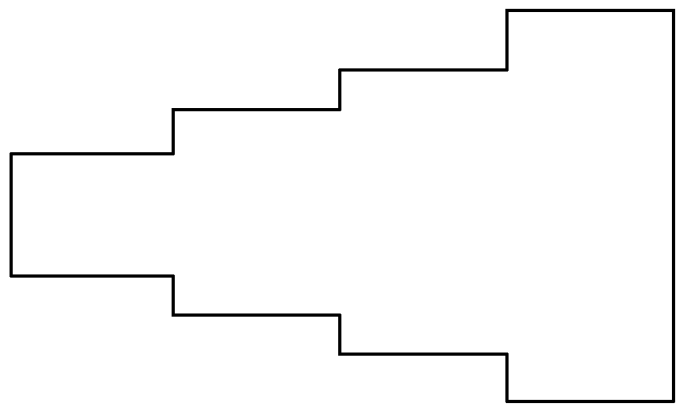
FIG. 9 shows a portion of an intermediate signal generated by combining pulses from four digital pins of a digital test instrument.

By increasing the number of pulses that are combined and the number of different widths of the pulses, the shape and/or resolution of the intermediate signal can be changed. For example, FIG. 8 shows part of an example intermediate signal produced using three pairs of digital pins, with each pair having different pulse widths. For example, FIG. 9 shows part an example intermediate signal produced using four pairs of digital pins, with each pair having different pulse widths. As described above, a filter smooths the intermediate waveform and a modulator circuit modulates an RF carrier signal using the waveform to produce a test signal. The test signal then may be used as described herein to test a DUT, for example.

In some implementations, pulses may be time-shifted with respect to each other but have same widths and/or different amplitudes. Pulses having these characteristics may be used synthesize a quantized analog waveform, that is, the intermediate signal.

The 802.15.4g standard can operate in different frequency bands. The lowest frequency band can be accessed directly with digital pulses without modulating an RF carrier. So, in some implementations, the test signal can be the waveform (a baseband signal) or the waveform can be modulated onto an RF carrier as described.

As noted previously, a waveform such as waveform 35 of FIG. 3 may encode data using bi-orthogonal keying. As explained previously, waveform 35 may be broken into timeslots, such as timeslots 36 and 40. Each timeslot may include a local maximum 37 as is the case in timeslot 36 or a local minimum 39 as is the case in timeslot 40. Each timeslot encodes multiple bits of data based on a polarity of the waveform within the timeslot and a timing of a local minimum or local maximum within the timeslot. For example, waveform 35 may encode two bits per timeslot. A first of the two bits may be based on the polarity of the signal in that timeslot and a second of the two bits may be based on whether the local minimum or the local maximum is nearer to the beginning or to the end of the timeslot. In an example, a single timeslot may transmit two bits having the following values 00, 01, 10, 11. In this example, 00 is indicated by a positive polarity and a local maximum that is before the midpoint of the timeslot; 01 is indicated by a positive polarity and a local maximum that is after the midpoint of the timeslot; 10 is indicated by a negative polarity and a local minimum that is before the midpoint of the timeslot; and 11 is indicated by a negative polarity and a local minimum that is after the midpoint of the timeslot.

In some implementations, a waveform such as waveform 35 may encode data differently than that described above. For example, each timeslot may encode three bits. A first of the three bits may be based on the polarity, a second of the three bits may be based on whether the local minimum or the local maximum is within the first half or the second half of the timeslot, and the third of the three bits may be based on whether the local minimum or the local maximum is nearer to the midpoint of the timeslot or nearer to the beginning or ending of the timeslot. Other encodings, which generate more than three bits per timeslot also may be used.

Figure 10:
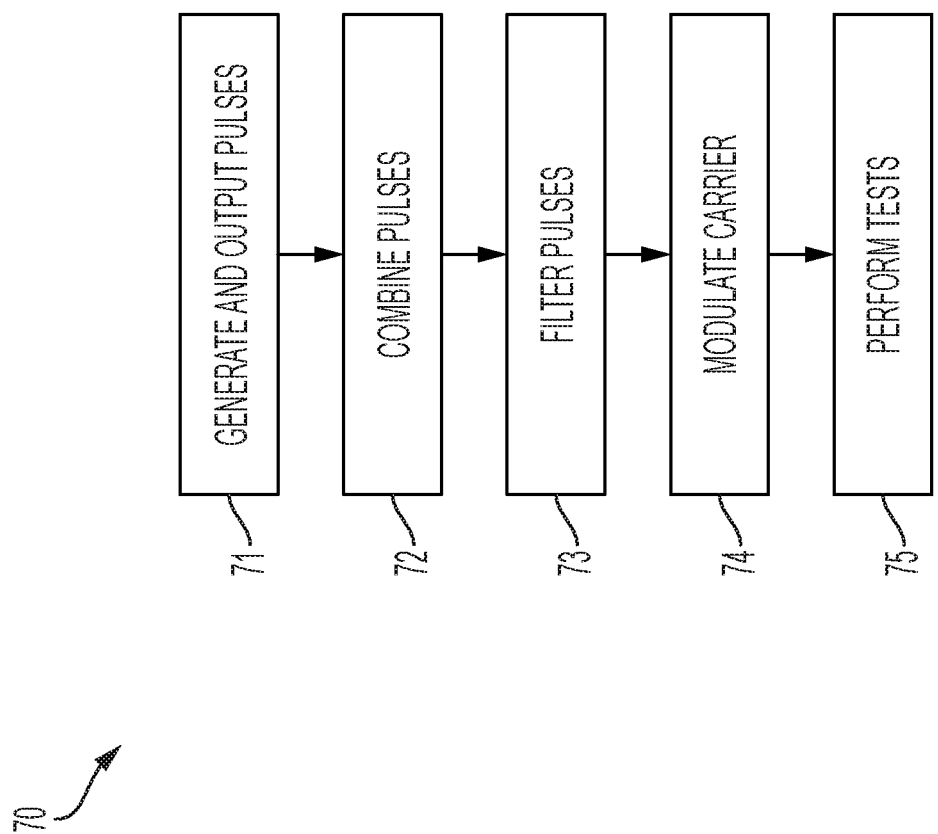
FIG. 10 is a flowchart showing an example process for generating a test signal based on pulses output on digital pins of a digital test instrument.

FIG. 10 shows an example of a process 70 that may be performed by ATE for generating a test signal using the example systems described herein. Process 70 includes generating (71) pulses that are to be used to produce a waveform for testing. Generating the pulses may include the digital instrument outputting a series of ones and zeroes—for example, high and low logic, or voltage, levels—on one or more pairs of digital pins. For example, a pattern generator controlling a first digital pin may output logic levels representing portions of the waveform that have positive polarity. For example, a pattern generator controlling a second digital pin may output logic levels representing portions of the waveform that have negative polarity. The pulses are output on two or more of the digital pins and over corresponding transmission media to circuitry 22 for generating a waveform and a test signal based on the pulses. As explained, in some examples the circuitry is located on the DIB and in some examples the circuitry is located in another test instrument, such as the RF instrument.

The circuitry combines (72) the pulses to produce an intermediate signal. As explained, pulses may be summed to produce the intermediate signal. Summing may include combining pulses from two, four, six, eight, ten, and so forth digital pins to produce an intermediate signal. In general, the more digital pins that are used, the greater the resolution that the intermediate signal will have. In some implementations, an even number of digital pins is used, with one digital pin of each pair of digital pins representing the positive polarity part of the signal and with the other digital pin of each pair of digital pins representing the negative polarity part of the signal. In some implementations, this need not be the case. For example, if the waveform is to have a single polarity, then there is no need to subtract pulses to create two polarities. In such cases, one, two, three, four, five, six, and so forth digital pins may carry pulses that are to be combined to produce an intermediate signal of appropriate resolution.

The circuitry filters (73) the intermediate signal to produce the waveform. As explained previously, in some implementations, the filter used is an bandpass filter (BPF). The bandpass filter may smooth the intermediate signal to produce the waveform. In some implementations, the bandpass filter is configured to generate a specific type of waveform. For example, the waveform of FIG. 3 is a raised root cosine time domain pulse that may be generated using an intermediate signal produced using two digital pins—one for positive polarity and one for negative polarity—and an appropriately configured bandpass filter. In some implementations, filters other than bandpass filters may be used to produce the waveform from the intermediate signal.

A modulator circuit modulates (74) an RF carrier signal using the waveform to produce a test signal. If necessary, the test signal may be sent to an instrument, such as RF instrument, from circuitry that is external to the RF instrument. The RF instrument uses the test signal to perform (75) one or more test on the DUT being tested by the ATE.

FIG. 11 shows an example of a process 80 that may be performed by ATE for generating digital pulses based, for example, on an analog—for example, RF—response signal received at the ATE from a DUT. According to process 80, a response signal is received (81) at circuitry 22. The response signal is demodulated (82) to produce an intermediate signal. The intermediate signal is then digitized (83) to produce digital pulses representing the intermediate signal. The digital pulses are output over one or more communication channels to the digital pins on the digital instrument. There, the digital signal may be analyzed to determine the DUT's response to a stimulus signal that produced the response signal. The DUT's response indicates whether the DUT passed or failed testing.

In some implementations, at least one of the digital pins is controllable to drive three levels, which include logic high, logic low, and high impedance. In some implementations, at least two of the digital pins, such as the digital pins corresponding to inputs 25 and 25, are controllable to drive three levels, which include logic high, logic low, and high impedance. In some implementations, all of the digital pins in a test instrument or a test system are controllable to drive three levels, which include logic high, logic low, and high impedance.

In some implementations, an example test system described herein is synchronous and timing/delay references described herein are with respect to a reference timing clock used throughout the test system.

All or part of the test systems and processes described in this specification and their various modifications may be configured or controlled at least in part by one or more computers using one or more computer programs tangibly embodied in one or more information carriers, such as in one or more non-transitory machine-readable storage media. A computer program can be written in any form of programming language, including compiled or interpreted languages, and it can be deployed in any form, including as a stand-alone program or as a module, part, subroutine, or other unit suitable for use in a computing environment. A computer program can be deployed to be executed on one computer or on multiple computers at one site or distributed across multiple sites and interconnected by a network.

Actions associated with configuring or controlling the test systems and processes can be performed by one or more programmable processors executing one or more computer programs to control all or some of the well formation operations described previously. All or part of the test systems and processes can be configured or controlled by special purpose logic circuitry, such as, an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only storage area or a random access storage area or both. Elements of a computer include one or more processors for executing instructions and one or more storage area devices for storing instructions and data. Generally, a computer will also include, or be operatively coupled to receive data from, or transfer data to, or both, one or more machine-readable storage media, such as mass storage devices for storing data, such as magnetic, magneto-optical disks, or optical disks. Non-transitory machine-readable storage media suitable for embodying computer program instructions and data include all forms of non-volatile storage area, including by way of example, semiconductor storage area devices, such as EPROM (erasable programmable read-only memory), EEPROM (electrically erasable programmable read-only memory), and flash storage area devices; magnetic disks, such as internal hard disks or removable disks; magneto-optical disks; and CD-ROM (compact disc read-only memory) and DVD-ROM (digital versatile disc read-only memory).

Elements of different implementations described may be combined to form other implementations not specifically set forth previously. Elements may be left out of the systems described previously without adversely affecting their operation or the operation of the system in general. Furthermore, various separate elements may be combined into one or more individual elements to perform the functions described in this specification.

Other implementations not specifically described in this specification are also within the scope of the following claims.

What is claimed is:

1. Automatic test equipment (ATE) comprising:
a first test instrument comprising digital pins that is capable of performing device testing, the first test instrument being configured to output pulses on at least two of the digital pins, where a first digital pin is for pulses having a positive polarity and a second digital pin is for pulses having a negative polarity;
circuitry comprising an adder to receive the pulses from the at least two digital pins and to combine the pulses to produce a signal and to generate a waveform based on the signal; and
a second test instrument that is capable of performing device testing, the second test instrument being configured to perform one or more tests on a device under test (DUT) based on the waveform, the second test instrument comprising a connection to a transmission line to output a test signal based on the waveform to the DUT to test the DUT;
wherein the device testing that the first test instrument is capable of performing and the device testing that the second test instrument is capable of performing each comprises outputting test signals to a respective device, receiving response signals based on the test signals, and processing the response signals.

2. The ATE of claim 1, wherein the first test instrument comprises a pattern generator to control the pulses.

3. The ATE of claim 1, wherein the first test instrument comprises a digital instrument that is programmable to produce the pulses and to vary parameters of the pulses on the at least two digital pins.

4. The ATE of claim 1, wherein the first test instrument comprises a digital instrument that is programmable to control a timing of the pulses on the at least two digital pins.

5. The ATE of claim 1, wherein the first test instrument comprises a digital instrument that is programmable to control widths of the pulses on the at least two digital pins.

6. The ATE of claim 1, wherein the first test instrument comprises a digital instrument that is programmable to control polarities of the pulses on the at least two digital pins.

7. The ATE of claim 1, wherein the first test instrument comprises a digital instrument that is programmable to control locations of the pulses on the at least two digital pins.

8. The ATE, of claim 1, wherein the first test instrument comprises a digital instrument that is programmable to control delays of the pulses on the at least two digital pins.

9. The ATE of claim 1, further comprising:
modulator circuitry to modulate a radio frequency (RF) carrier signal using the waveform to produce the test signal;
wherein the second test instrument is configured to perform the one or more tests by outputting the test signal to the DUT.

10. The ATE of claim 1, wherein the test signal comprises the waveform.

11. The ATE of claim 1, wherein the first test instrument is a digital test instrument; and
wherein the second test instrument is a radio frequency (RF) test instrument.

12. The ATE of claim 1, wherein the circuitry comprises a bandpass filter.

13. The ATE of claim 1, wherein the at least two digital pins comprises two or more pairs of digital pins, the two or more pairs of digital pins comprising a first pair of digital pins including the first digital pin and a second pair of digital pins including the second digital pin;
wherein first pulses on a first pair of digital pins are wider than second pulses on the second pair of digital pins; and
wherein the adder is configured to add the first pulses and the second pulses.

14. The ATE of claim 13, wherein the signal is an intermediate signal and generating the waveform comprises filtering the intermediate signal to produce the waveform; and
wherein adding the first pulses and the second pulses produces the intermediate signal having multiple steps.

15. The ATE of claim 1, wherein the at least two digital pins comprises two or more pairs of digital pins, the two or more pairs of digital pins comprising a first pair of digital pins including the first digital pin and a second pair of digital pins including the second digital pin;
wherein first pulses on a first pair of digital pins have different amplitudes than second pulses on the second pair of digital pins; and
wherein the adder is configured to add the first pulses and the second pulses.

16. The ATE of claim 1, wherein the waveform is broken into timeslots, each timeslot encoding multiple bits of data based on a polarity of the waveform within the timeslot and a timing of a local minimum or local maximum within the timeslot.

17. The ATE of claim 16, wherein the waveform encodes two bits per timeslot, a first of the two bits being based on the polarity and a second of the two bits being based on whether the local minimum or the local maximum is nearer to a beginning or to an end of the timeslot.

18. The ATE of claim 1, wherein the first test instrument is configured to introduce delay into the pulses on the at least two digital pins to simulate time-of-flight delays of the waveform through air.

19. The ATE of claim 1, wherein the waveform is produced independent of a dedicated waveform generator.

20. The ATE of claim 1, wherein at least one of the digital pins is controllable to drive three levels, the three levels including logic high, logic low, and high impedance.

21. The ATE of claim 1, wherein:
the second test instrument is configured to receive a second waveform from the DUT over the connection to the transmission line, the second waveform being analog and being based on the test signal output to the DUT;
wherein the second test instrument comprises second circuitry comprising a digitizer to generate second pulses based on the second waveform; and wherein the first test instrument or a third test instrument is configured to receive the second pulses and to process the second pulses to test the DUT;

wherein the third test instrument is capable of performing device testing comprising outputting second test signals to a device, receiving second response signals based on the second test signals, and processing the second response signals.

22. The ATE of claim 21, wherein the second test instrument is a radio frequency (RF) test instrument; and
wherein the first test instrument is a digital test instrument.

23. The ATE of claim 1, wherein the circuitry is part of the second test instrument.

24. A method of producing a waveform, comprising:
outputting pulses on at least two digital pins of a first test instrument in automatic test equipment (ATE), the first test instrument being capable of performing device testing and generating the pulses, where a first digital pin is for pulses having a positive polarity and a second digital pin is for pulses having a negative polarity;
combining the pulses to produce a signal;
generating the waveform based on the signal; and
a second test instrument that is capable of performing device testing, the second test instrument performing, based on the waveform, one or more tests on a device under test (DUT) being tested by the ATE, the second test instrument comprising a connection to a transmission line to output a test signal based on the waveform to the DUT to test the DUT;
wherein the device testing that the first test instrument is capable of performing and the device testing that the second test instrument is capable of performing each comprises outputting test signals to a respective device, receiving response signals based on the test signals, and processing the response signals.

25. The method of claim 24, further comprising:
controlling the pulses using a pattern generator.

26. The method of claim 25, further comprising:
programming a digital instrument to produce the pulses on the at least two digital pins, the digital instrument comprising the first test instrument.

27. The method of claim 26, further comprising:
programming the digital instrument to control a timing of the pulses on the at least two digital pins.

28. The method of claim 26, further comprising:
programming the digital instrument to control polarities of the pulses on the at least two digital pins.

29. The method of claim 26, further comprising:
programming the digital instrument to control locations of the pulses on the at least two digital pins.

30. The method of claim 26, further comprising:
programming the digital instrument to control delays of the pulses on the at least two digital pins.

31. The method of claim 24, further comprising:
modulating a radio frequency (RF) carrier signal using the waveform to produce the test signal;
wherein performing the one or more tests comprises outputting the test signal to the DUT.

32. The method of claim 24, further comprising:
performing the one or more tests using the waveform.

33. The method of claim 24, wherein:
the first test instrument comprises a digital test instrument comprising the at least two digital pins;
the second test instrument comprises a radio frequency (RF) test instrument for performing the one or more tests on the DUT; and
modulator circuitry in the first test instrument modulates a radio frequency (RF) carrier signal using the waveform to produce the test signal for output to the DUT by the RF test instrument to perform the one or more tests.

34. The method of claim 24, wherein the waveform is filtered using a bandpass filter.

35. The method of claim 24, wherein the at least two digital pins comprises two or more pairs of digital pins, the two or more pairs of digital pins comprising a first pair of digital pins including the first digital pin and a second pair of digital pins including the second digital pin;
wherein first pulses on the first pair of digital pins are wider than second pulses on the second pair of digital pins; and
wherein combining the pulses comprises adding the first pulses and the second pulses.

36. The method of claim 35, wherein generating the waveform comprises filtering the signal; and
wherein the combining the pulses, comprises adding the first pulses and the second pulses to produce the signal, the signal having multiple steps.

37. The method of claim 24, wherein the waveform is broken into timeslots, each timeslot encoding multiple bits of data based on a polarity of the waveform within the timeslot and a timing of a local minimum or local maximum within the timeslot.

38. The method of claim 37, wherein the waveform encodes two bits per timeslot, a first of the two bits being based on the polarity and a second of the two bits being based on whether the local minimum or local maximum is nearer to the beginning or to the end of the timeslot.

39. The method of claim 24, further comprising:
introducing delay into the pulses on the at least two digital pins to simulate time-of-flight delays of the waveform through air.

40. The method of claim 24, further comprising:
programming a digital instrument to control widths of the pulses on the at least two digital pins, the digital instrument comprising the first test instrument.

* * * * *